(12) United States Patent
Botha

(10) Patent No.: US 7,385,949 B1
(45) Date of Patent: Jun. 10, 2008

(54) SYSTEM AND METHOD FOR DE-INTERLEAVING DATA IN A WIRELESS RECEIVER

(75) Inventor: Louis Jacobus Botha, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 137 days.

(21) Appl. No.: 09/873,316

(22) Filed: Jun. 5, 2001

(51) Int. Cl.
H04Q 7/00 (2006.01)

(52) U.S. Cl. .................. 370/329; 370/412; 714/763

(58) Field of Classification Search .......... 370/342, 370/320, 441, 479, 329, 335, 395.62, 468, 370/321, 411–419; 375/130, 136, 262, 341, 375/146, 147; 714/755, 1, 763, 157, 701, 714/702, 761, 788, 762; 455/452, 450, 451, 455/452.1, 452.2
See application file for complete search history.

(56) References Cited

U.S. PATENT DOCUMENTS

| | | | |
|---|---|---|---|
| 5,414,738 A | 5/1995 | Bienz | |
| 5,519,734 A | 5/1996 | Ben-Efraim | |
| 5,537,420 A | 7/1996 | Huang | |
| 5,548,616 A | 8/1996 | Mucke et al. | |
| 5,592,492 A | 1/1997 | Ben-Efraim et al. | |
| 5,602,836 A | 2/1997 | Papadopoulos et al. | |
| 5,635,864 A | 6/1997 | Jones | |
| 5,659,580 A | 8/1997 | Partyka | |
| 5,687,181 A | 11/1997 | Suemura et al. | |
| 5,719,875 A * | 2/1998 | Wei .............................. 714/701 |
| 5,745,497 A | 4/1998 | Ben-Efraim et al. | |
| 5,761,249 A | 6/1998 | Ben-Efraim | |
| 5,778,414 A | 7/1998 | Winter et al. | |
| 5,838,728 A | 11/1998 | Alamouti et al. | |
| 5,867,400 A | 2/1999 | El-Ghoroury et al. | |
| 5,910,960 A | 6/1999 | Claydon et al. | |
| 5,912,898 A | 6/1999 | Khoury | |
| 5,946,357 A * | 8/1999 | Sandin et al. ............... 375/296 |
| 5,983,383 A | 11/1999 | Wolf | |
| 6,064,664 A | 5/2000 | Kim | |
| 6,084,926 A | 7/2000 | Zak et al. | |
| 6,141,721 A | 10/2000 | Patterson et al. | |
| 6,151,690 A | 11/2000 | Peeters | |

(Continued)

FOREIGN PATENT DOCUMENTS

EP 0551973 A 7/1993

(Continued)

OTHER PUBLICATIONS

Patent Abstracts of Japan, vol. 2000 No. 21, Aug. 3, 2001.

Primary Examiner—Edan Orgad
Assistant Examiner—Chuong Ho
(74) Attorney, Agent, or Firm—McAndrews, Held & Malloy, Ltd.

(57) ABSTRACT

A system and method for de-interleaving data in a wireless receiver, wherein a single memory buffer is coupled to a read/write unit that performs both first and second de-interleaving operations. According to a first aspect of the present invention, the read/write unit performs the second de-interleaving operation as data is written to the memory buffer, and performs the first de-interleaving operation as data is read from the memory buffer. According to a second aspect of the present invention, the read/write unit performs the first and second de-interleaving operations as data is read from the memory buffer.

18 Claims, 9 Drawing Sheets

U.S. PATENT DOCUMENTS

| | | | |
|---|---|---|---|
| 6,154,513 A | 11/2000 | Tachibana et al. | |
| 6,163,766 A | 12/2000 | Kleider et al. | |
| 6,175,590 B1 | 1/2001 | Stein | |
| 6,182,261 B1 | 1/2001 | Haller et al. | |
| 6,185,200 B1 * | 2/2001 | Prasad | 370/341 |
| 6,421,333 B1 | 7/2002 | Jalali | |
| 6,564,343 B1 * | 5/2003 | Yamashita | 714/701 |
| 6,598,198 B1 * | 7/2003 | Furuta et al. | 714/763 |
| 6,624,767 B1 * | 9/2003 | Shiu et al. | 341/81 |
| 6,714,606 B1 * | 3/2004 | Qian et al. | 375/341 |
| 6,828,926 B2 * | 12/2004 | Jaffe et al. | 341/81 |
| 6,971,057 B1 * | 11/2005 | Delvaux et al. | 714/788 |
| 7,203,527 B2 * | 4/2007 | Czaja et al. | 455/574 |
| 2003/0128722 A1 | 7/2003 | Woodard | |
| 2007/0071139 A1 * | 3/2007 | Arslan et al. | 375/340 |

FOREIGN PATENT DOCUMENTS

| | | |
|---|---|---|
| GB | 2380598 A | 4/2003 |
| JP | 2001102939 A | 4/2001 |

\* cited by examiner

404

SYSTEM AND METHOD FOR DE-INTERLEAVING DATA IN A WIRELESS RECEIVER

CROSS-REFERENCE TO RELATED APPLICATIONS

This application is related to U.S. patent application Ser. No. 09/873,310, now issued U.S. Pat. No. 7,272,769 B1 with an issue date of Sep. 18, 2007, entitled "System and Method for Interleaving Data in a Wireless Transmitter," filed concurrently herewith, with a filing date of Jun. 5, 2001, the entirety of which is incorporated herein by reference.

BACKGROUND

1. Field of the Invention

The present invention relates generally to wireless communications and more particularly to a system and method for de-interleaving data in a wireless receiver.

2. Discussion of the Related Art

The Third Generation Partnership Project (3GPP) represents the joint effort of various standards setting bodies to produce globally applicable technical specifications and technical reports for the Universal Mobile Telecommunications System (UMTS). The UMTS is based on evolved Global System for Mobile Communications (GSM) core networks and the radio access technologies that they support (i.e., Universal Terrestrial Radio Access Network (UTRAN) including both Frequency Division Duplex (FDD) and Time Division Duplex (TDD) modes).

The 3GPP UTRAN FDD transmitter chain includes two interleavers. The first interleaves data to be transmitted into different radio frames, and the second interleaves the data inside each radio frame. The transmitted radio frames must then be de-interleaved at the receiver. Conventional receiver designs include two de-interleavers that mirror the operations of the two interleavers in the transmitter. Each de-interleaver according to conventional designs has an associated memory buffer. The memory buffer associated with the second de-interleaver is double buffered so that the data received from the air in the current radio frame can be written into memory (a first buffer) while the rest of the receiver chain processes data from the previous radio frame (a second buffer). The memory buffer associated with the first de-interleaver does not have to be double buffered because the data can be processed asynchronously (as long as the data is processed in one radio frame).

A read/write unit is used to read from and write to the memory buffers. The read/write unit includes, for example, programmable logic for generating memory buffer addresses. According to conventional designs, a separate read/write unit is associated with each memory buffer. These read/write units require an amount of chip real estate and power that can be significant in terms of the receiver design. This is particularly true where chip real estate and power usage are at a premium, such as in the design of wireless handsets. Furthermore, moving the receiver data between the two de-interleaver memory buffers requires two write operations and two read operations for every bit of received data. Performing each of these operations requires power, which again can be particularly significant where conserving power usage is important.

What is needed is an improved system and method for de-interleaving data in a wireless receiver, where chip real estate and power usage are reduced.

SUMMARY OF THE INVENTION

The present invention addresses these concerns by providing a system and method for de-interleaving data in a wireless receiver, wherein a single memory buffer is coupled to a read/write unit that performs both first and second de-interleaving operations. According to a first aspect of the present invention, the read/write unit performs the second de-interleaving operation as data is written to the memory buffer, and performs the first de-interleaving operation as data is read from the memory buffer. According to a second aspect of the present invention, the read/write unit performs the first and second de-interleaving operations as data is read from the memory buffer.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Figure 1:
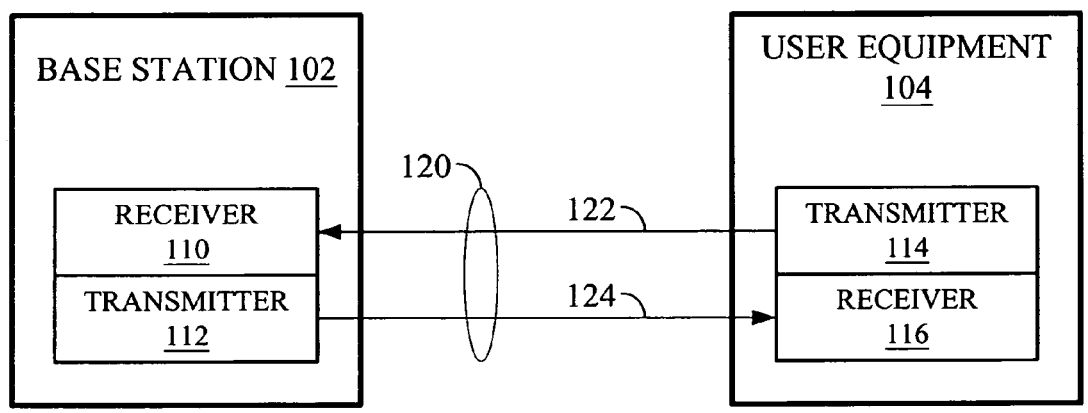
FIG. 1 depicts a wireless communications environment, wherein user equipment communicates with a base station via a wireless link.

The present invention provides a system and method for de-interleaving data in a wireless receiver. According to the present invention, a single memory buffer and read/write unit are used for the first and second de-interleaving operations. FIG. 1 depicts a wireless communications environment 100 within which the present invention operates. As shown, user equipment (UE) 104 communicates with a base station 102 via a wireless link 120. Wireless link 120 includes an uplink 122 and a downlink 124. A transmitter 112 in base station 102 transmits radio frames of data over downlink 124 that are received by a receiver 116 in UE 104. Similarly, a transmitter 114 in UE 104 transmits radio frames over uplink 122 that are received by a receiver 110 in base station 102. As will be apparent to those skilled in the art, the transmitter/receiver pairs in base station 102 and UE 104 can be implemented, for example, as separate functional units (as depicted in FIG. 1) or as a single transceiver unit.

According to an example embodiment of the present invention, transmitters 112 and 114 comply with the requirements set forth in 3GPP UTRAN FDD transmitter specifications, such as 3GPP TS 25.212 V3.5.0 (200-12) entitled "$3^{rd}$ Generation Partnership Project; Technical Specification Group Radio Access Network; Multiplexing and channel coding (FDD)" (Release 1999), the entirety of which is incorporated herein by reference. This specification is referred to herein as the 25.212 specification. The operation of a conventional downlink transmitter 112 and downlink receiver 116 according to the 25.212 specification are summarized in the following two sections. This is followed by a description of downlink receiver 116 having a unified de-interleaver according to various example embodiments of the present invention. Though the principles of the present invention are described in the context of downlink 124 for illustrative purposes, it will be apparent to those skilled in the art that these principles can also be applied to uplink receiver 110.

3GPP Downlink Transmitter

Figure 2A:
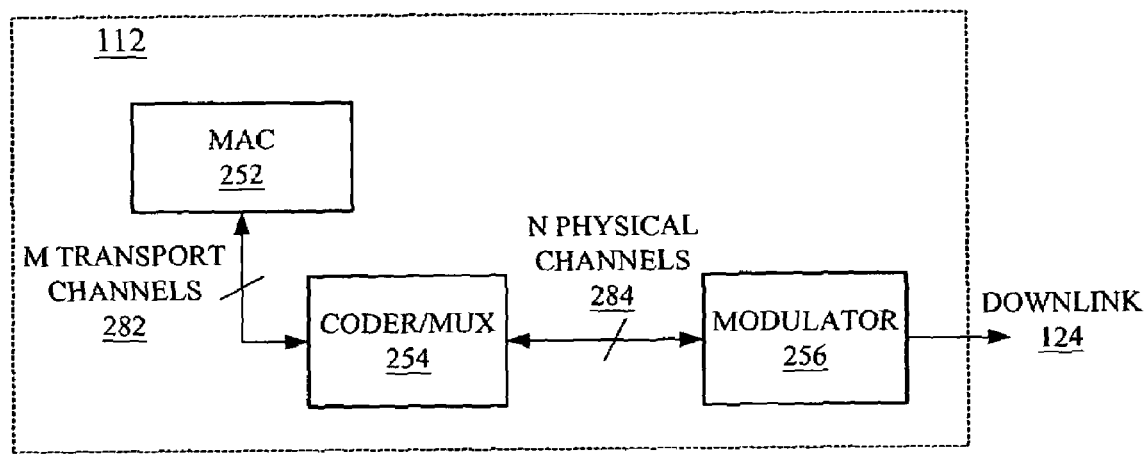
FIG. 2A depicts an example downlink transmitter according to a conventional transmitter design.

FIG. 2A depicts downlink transmitter 112 in greater detail. As shown, downlink transmitter 112 includes a medium access control (MAC) layer 252, a coding/multiplexing unit 254, and a modulator 256. The specifications of these components are described in detail in various 3GPP UTRAN FDD specifications. Coding/multiplexing unit 254 exchanges data with MAC 252 in the form of transport block sets from one or more transport channels 282 (the number of transport channels is given by M). Coding/multiplexing unit 254 processes and multiplexes together these transport blocks into radio frame data over one or more physical channels 284 (the number of physical channels is given by N). For example, the current 3GPP UTRAN FDD transmitter implementation allows up to eight physical channels in downlink 124 and six physical channels in uplink 122. However, it will be apparent that the principles described herein are extensible to any number of physical channels. Modulator 256 modulates the radio frame data from physical channels 284 for transmission over downlink 124.

Figure 2B:
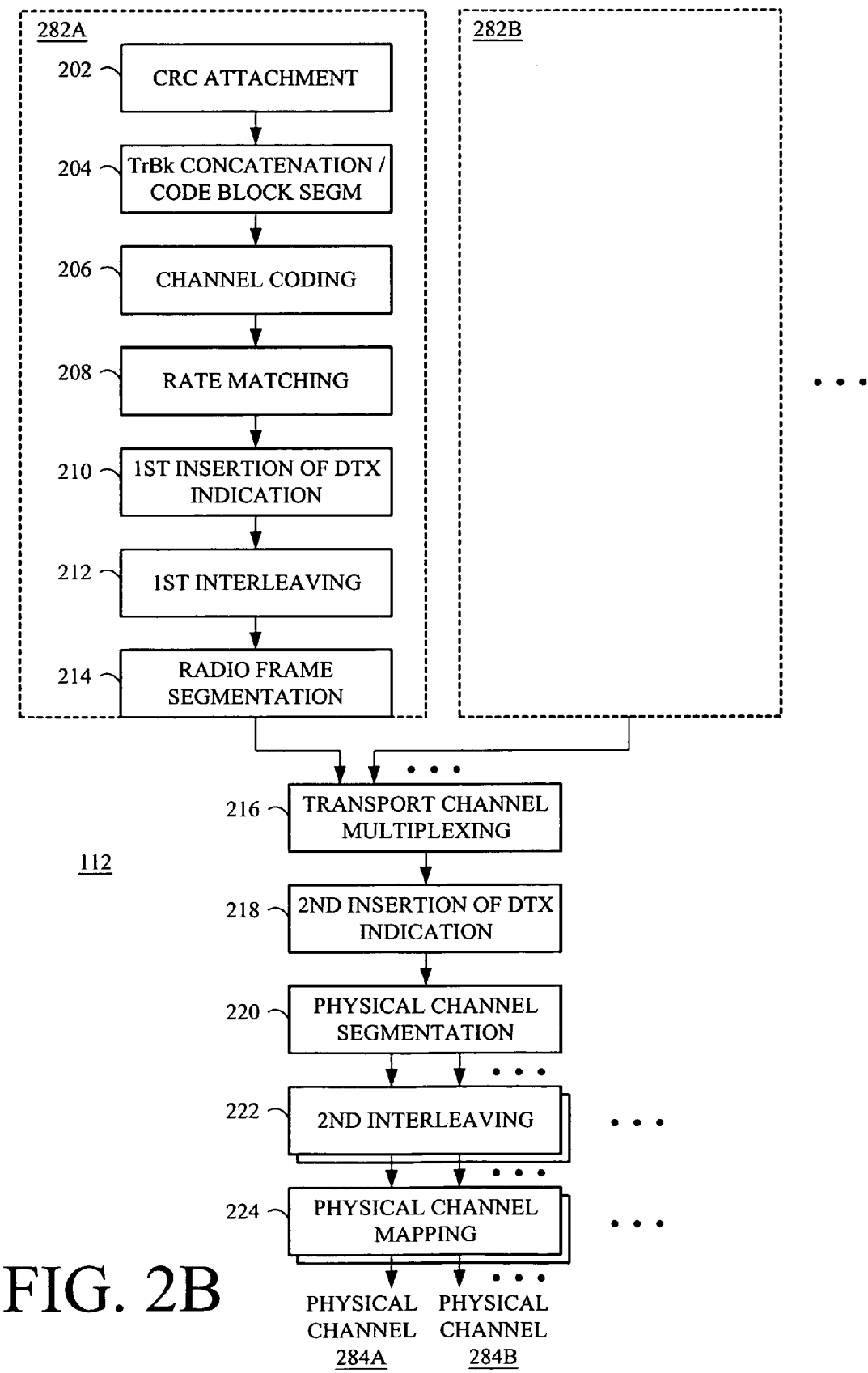
FIG. 2B depicts the operations performed by an example downlink transmitter according to a conventional transmitter design.

FIG. 2B summarizes the operation of coding/multiplexing unit 254 according to the 25.212 specification. In operation 202, error detection is provided by adding a Cyclic Redundancy Check (CRC) to the transport blocks. The size of the CRC for each transport channel 282 is signaled from higher software layers (not shown). In operation 204, transport block concatenation and code block segmentation are performed. All transport blocks in a transport time interval (TTI) are serially concatenated, and then segmented into code blocks. If the number of bits in a TTI is larger than the maximum size of a code block in question, then code block segmentation is performed after the concatenation of the transport blocks. The maximum size of the code blocks depends on whether convolutional coding, turbo coding or no coding is used for the transport channel. In operation 206, one of these three coding schemes is applied to the data in each transport channel 282.

In operation 208, rate matching is performed wherein bits on each transport channel 282 are repeated or punctured. Higher layers assign a rate-matching attribute for each transport channel 282. The rate-matching attribute is used when the number of bits to be repeated or punctured is calculated. The number of bits on a transport channel can vary between different TTIs. In downlink 124, the transmission is interrupted if the number of bits is lower than the minimum.

Discontinuous transmission (DTX) indication bits are used to fill up the radio frame with bits. The insertion point of DTX indication bits depends on whether fixed or flexible positions of the transport channels in the radio frame are used. It is up to the UTRAN to decide for each transport channel whether fixed or flexible positions are used during the connection. DTX indication bits only indicate when the transmission should be turned off—they are not transmitted. In operation 210, DTX indication bits are used only if the positions of the transport channels in the radio frame are fixed. DTX indication bits inserted in operation 218 are placed at the end of the radio frame.

In operation 212, a first interleaving is performed wherein data is interleaved into different radio frames. As described in the 25.212 specification, a block interleaver with inter-column permutations is used to perform this operation. In operation 214, when the TTI is longer than 10 ms, the input bit sequence is segmented and mapped into consecutive radio frames. As shown in FIG. 2B, operations 202 through 214 are performed for each transport channel 282.

In operation 216, radio frames are received from each transport channel 282 every 10 ms and are then serially multiplexed into a coded composite transport channel. In operation 220, physical channel segmentation divides each radio frame into physical channel frames, one such frame for each physical channel 284 (when more than one physical channel is used).

In operation 222, the second interleaving operation is performed, wherein the data inside each radio frame is interleaved. According to the block interleaver described in the 25.212 specification, bits are padded and input to a matrix having an inter-column permutation. Bits are then output from the matrix with pruning. In operation 224, the physical channel frames of interleaved data are mapped to physical channels 284 and sent to modulator 256 for transmission.

3GPP Downlink Receiver

Figure 3A:
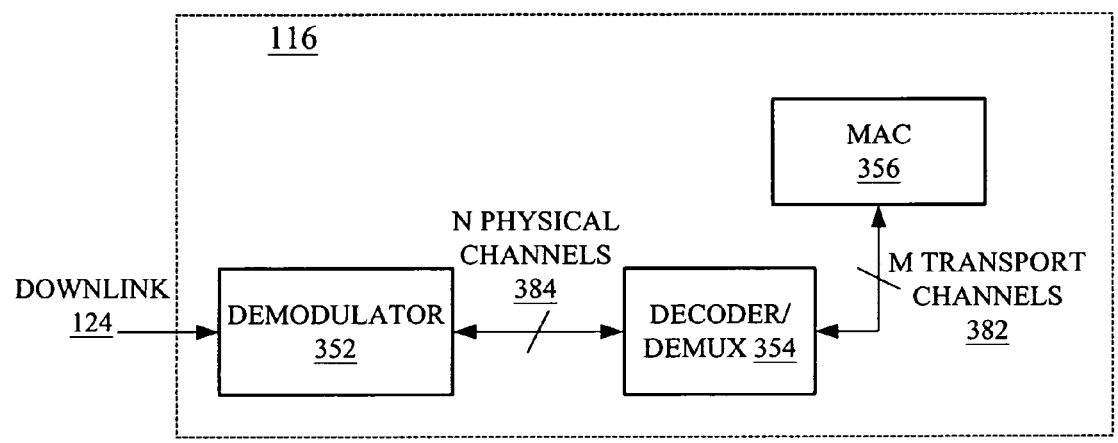
FIG. 3A depicts an example downlink receiver according to a conventional receiver design.

Turning now to the 3GPP downlink receiver, FIG. 3A depicts downlink receiver 116 in greater detail. As shown, downlink receiver 116 includes a MAC layer 356, a decoding/demultiplexing unit 354, and a demodulator 352. These components operate in compliance with the various 3GPP UTRAN FDD specifications, mirroring the operations of the related components described above with respect to downlink transmitter 116. Demodulator 352 demodulates data received over downlink 124 into N physical channels 384. Decoding/demultiplexing unit 354 processes and demultiplexes the physical channels into transport blocks in M transport channels 382.

Figure 3B:
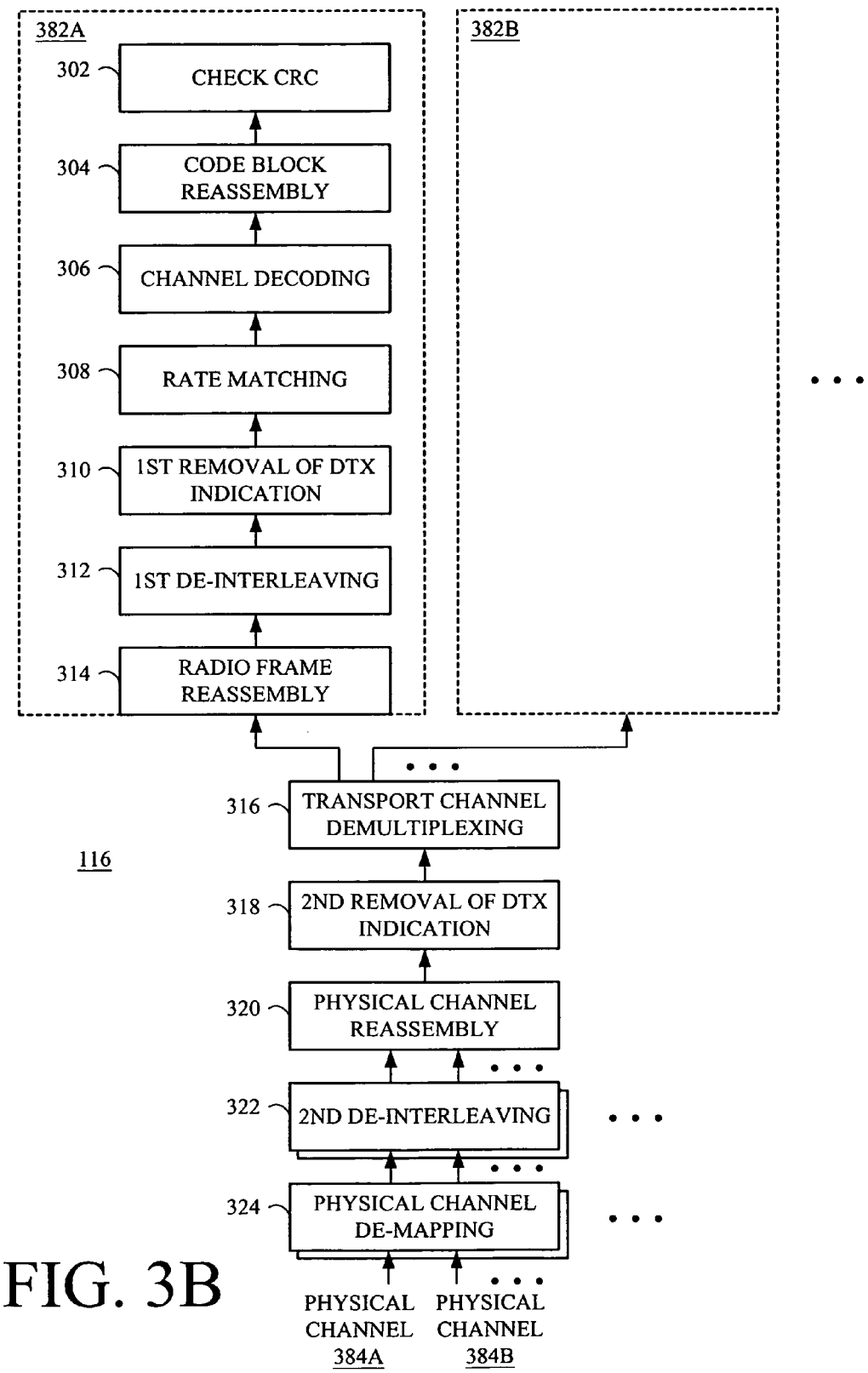
FIG. 3B depicts the operations performed by an example downlink receiver according to a conventional receiver design.

FIG. 3B depicts the operations of decoding/demultiplexing unit 354 in greater detail according to operation in compliance with the 25.212 specification. Data received via downlink 124 in N physical channels 384 is processed and demultiplexed into M transport channels 382. As will be apparent, the receiver operations depicted in FIG. 3B mirror the transmitter operations depicted in FIG. 2B. As shown in FIG. 3B, two de-interleaving operations are performed (operations 322 and 312). Several operations are performed between the two de-interleaving operations: physical channel re-assembly (operation 320), second removal of DTX indication (operation 318), transport channel de-multiplexing (operation 316), and radio frame re-assembly (operation 314).

Figure 3C:
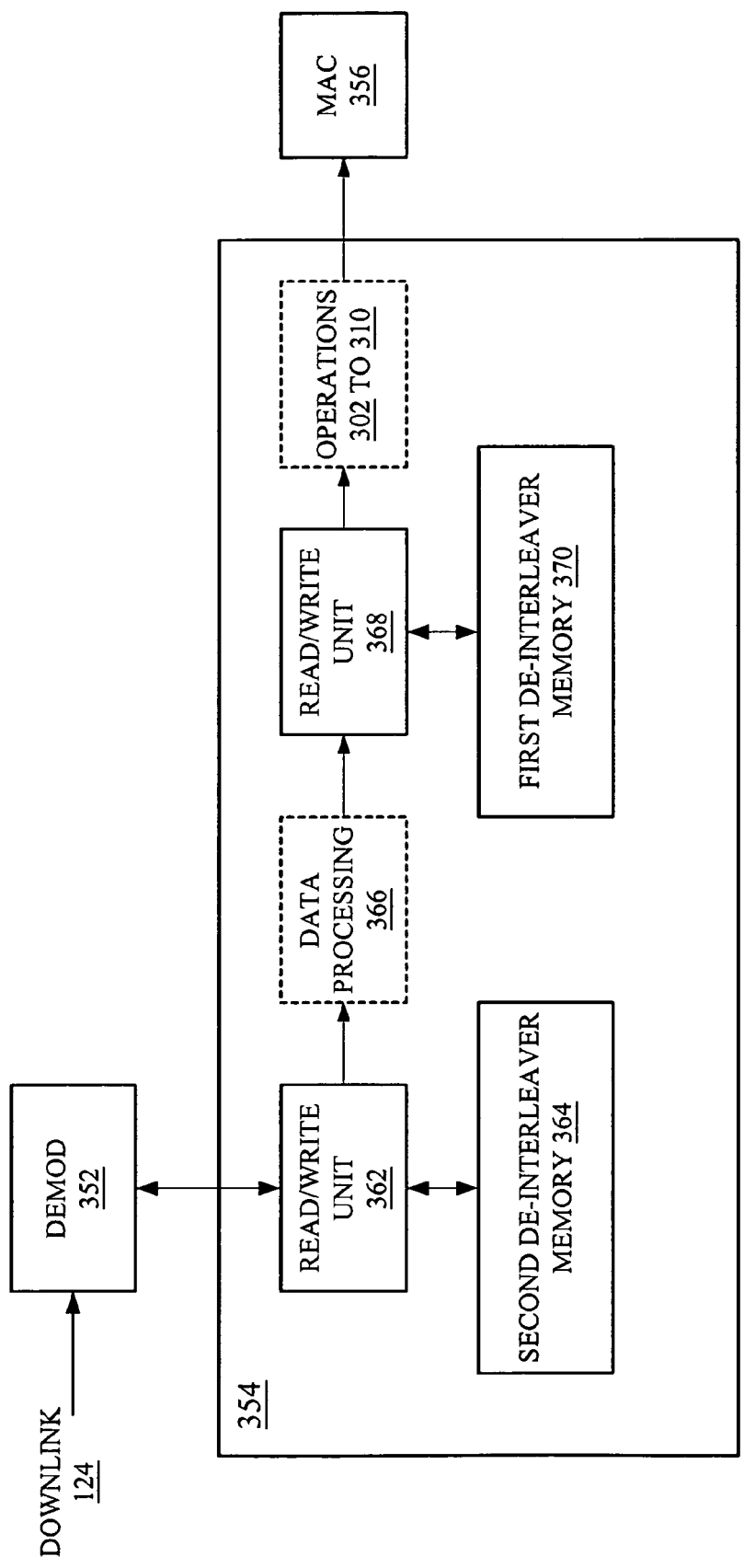
FIG. 3C depicts a decoding/demultiplexing unit in greater detail according to a conventional double-buffered design.

The operations decoding/demultiplexing unit 354 will be described in conjunction with FIG. 3C, which depicts decoding/demultiplexing unit 354 in greater detail according to a conventional design that includes a memory buffer for each de-interleaving operation. Decoding/demultiplexing unit 354 includes read/write units 362 and 368, a second de-interleaver memory 364, and a first de-interleaver memory 370. A data processing block 366 represents the receiver chain processes between the first and second de-interleaving (operations 314 through 320). As shown in FIG. 3C, operations 302 through 310 are performed on the output of read/write unit 368.

According to a first conventional receiver design, second de-interleaver memory 364 is double-buffered. Data received via downlink 124 from the current radio frame is written into a first memory buffer (not shown), while data processing block 366 processes data from the previous radio frame stored in a second memory buffer (not shown). By comparison, first de-interleaver memory 370 according to a convention design is implemented as a single-buffered memory.

Read/write units 362 and 368 cause data to be written to and read from their respective memory buffers (364 and 370). Read/write units 362 and 368 represent hardware, software, or a combination of hardware and software that is configured to write to and read from their respective memory buffer in the manner described in the 25.212 specification. For example, the read/write operations described herein can be performed in hardware under the control of parameters stored in registers, where the parameters are set up by software.

Focusing on the two de-interleaving operations and the operations in between, the second de-interleaver receives one physical channel frame per physical channel, per radio frame. Read/write unit 362 causes this data to be stored in second de-interleaving memory 364. The physical channel frames are de-interleaved according to the reverse of the second interleaving operation described above, and then passed on to the operations represented by data processing 366. The size of the physical channel frame depends on the spreading factor, and also on the compressed mode parameters. According to the 25.212 specification, the maximum physical channel frame size occurs when the compressed mode is not selected, and the minimum spreading factor of 4 is used. In this case the maximum physical channel frame size is 3,840,000 (chips per second)/4 (spreading factor)*0.01 (radio frame length in seconds)*2(serial to 2-bit parallel converter)=19,200 bits.

In physical channel re-assembly (operation 320), bits are taken from all the physical channels that received data in the radio frame and concatenated into one data stream (a coded composite transport channel). In the second removal of DTX bits (operation 318), specified bits at the end of the data stream that were inserted by downlink transmitter 112 are removed (i.e., ignored). In transport channel de-multiplexing (operation 316), the first part of the data stream is processed for the first transport channel, the next part of the data stream is processed for the next transport channel, and so on, until all the data has been distributed to transport channels 382.

In radio frame re-assembly (operation 314), data received in multiple radio frames is concatenated into one bit stream. Read/write unit 368 causes this bit stream to be stored in first de-interleaver memory 370. In operation 312, the data stored in first de-interleaver memory 370 is de-interleaved according to the reverse of the first interleaving operation described above. Read/write unit 368 causes de-interleaved data to be read from first de-interleaver memory 370 and output to the decoder and the remaining downstream processing (operations 302 through 306).

3GPP Downlink Receiver with Unified De-Interleaver

Figure 4:
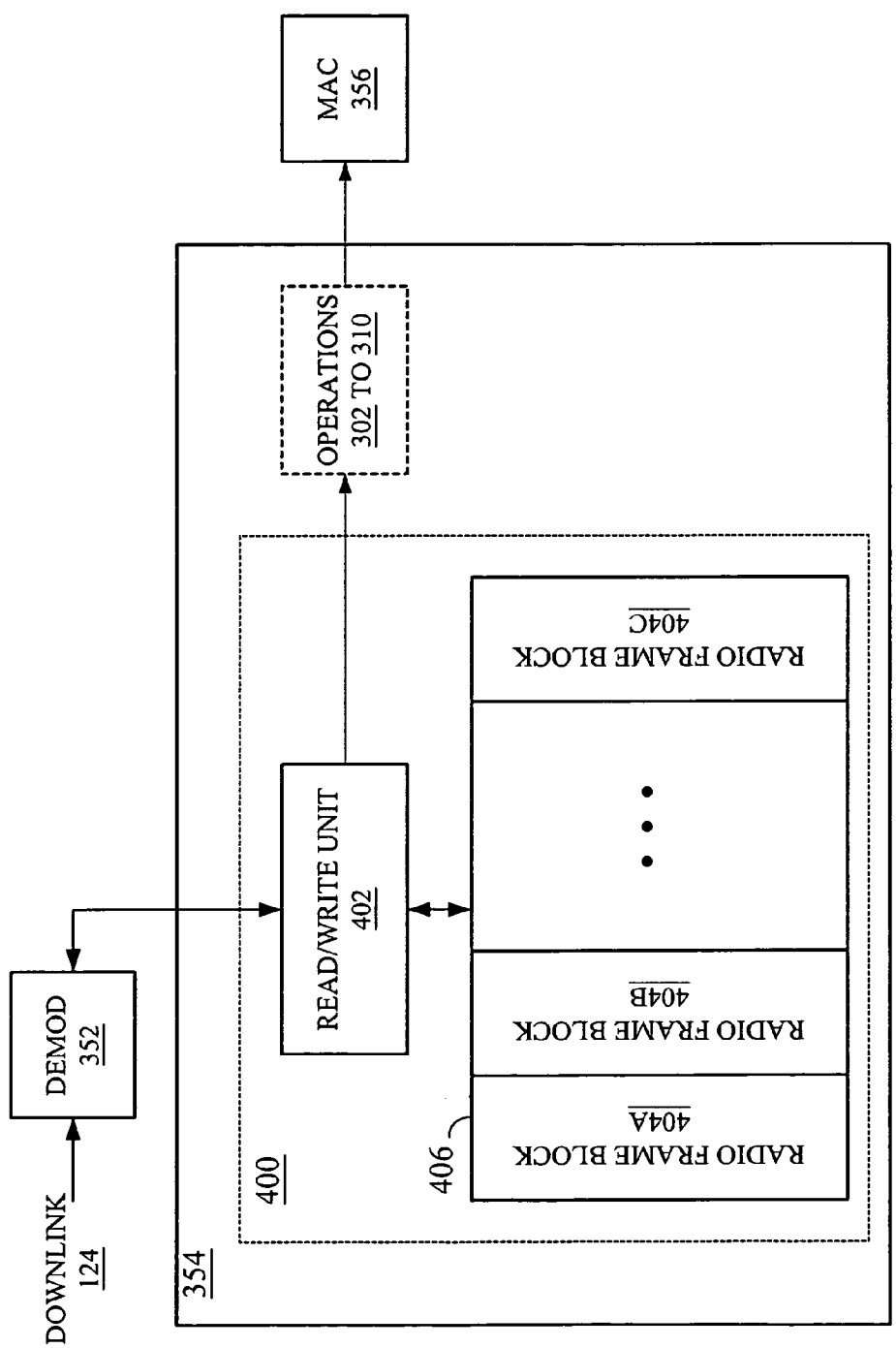
FIG. 4 depicts a unified de-interleaver according to an example embodiment of the present invention.

FIG. 4 depicts a unified de-interleaver 400 within decoding/demultiplexing unit 354 according to an example embodiment of the present invention, wherein the first and second de-interleaving operations are combined so that a single block of memory is used, along with a single read/write unit. The combined operation includes the first and second de-interleaving operations, as well as the operations that occur between the two in the conventional design (operations 314 through 320). As shown in FIG. 4, unified de-interleaver 400 includes a single read/write unit 402 and a memory 406.

Read/write unit 402 receives an input bit stream of demodulated radio frame data in N physical channels 384 from demodulator 352. Read/write unit 402 writes this data to memory 406 according to a specified pattern. Read/write unit 402 reads data out of memory 406, also according to a specified pattern, creating an output bit stream that is passed on to operations 302 through 310. As described above with respect to read/write units 362 and 368, read/write unit 402 represents hardware, software, or a combination of hardware and software that is configured to write to and read from memory 406 in the manner described below.

Memory 406 is divided into two or more radio frame blocks 404 (shown as 404A through 404C). Each radio frame block 404 stores a single radio frame of data. In the 3GPP receiver, memory 406 includes at least nine radio frame blocks 404 since first de-interleaving operation 312 can utilize data from up to eight radio frames (where TTI=80 ms), while a ninth radio frame is being received. As will be described below, additional radio frame blocks 404 can be added to provide additional buffering.

Figure 5:
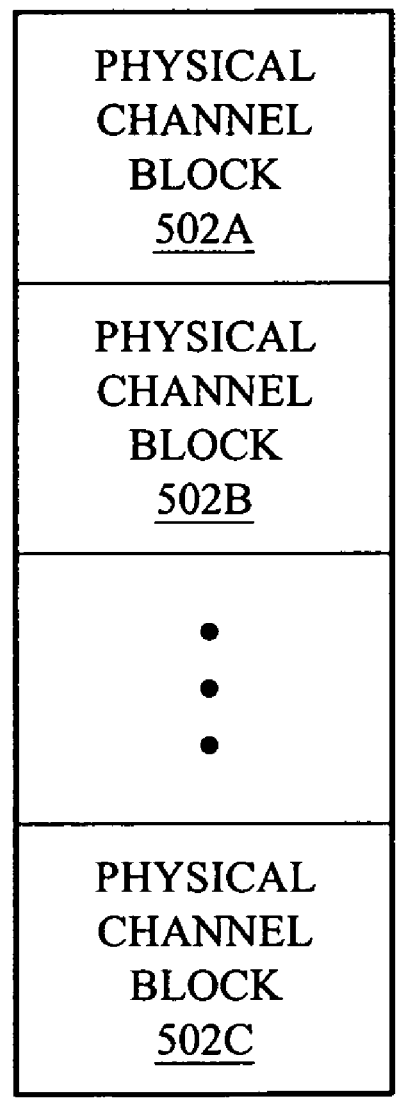
FIG. 5 depicts an example radio frame block divided into physical channel blocks.

FIG. 5 depicts an example radio frame block 404 further sub-divided into one or more physical channel blocks 502 (shown as 502A through 502C). The physical channel frames making up each radio frame are stored in physical channel blocks 502. Physical channel blocks 502 are sized to accommodate the maximum physical channel frame size allowed by the system. As described above, in the 3GPP receiver the maximum physical channel frame size is 19,200 bits per physical channel. Similarly, radio frame blocks 404 are sized to handle the maximum total frame size allowed by the system. The 3GPP FDD specification sets this maximum at 76,800 bits.

Both radio frame blocks 404 and physical channel blocks 502 represent logical divisions of memory 406. As will be apparent, memory 406 can be implemented using a single memory device, or multiple memory devices where the logical divisions may or may not correspond to physical divisions between devices. According to a first example embodiment of the present invention, memory 406 is implemented using a separate single-ported memory device for each radio frame block 404A. New data from the next radio frame is written to memory 406 as stored data is read out. The size of memory 406 is therefore 691,200 bits: 9(8 radio frame blocks plus one used as a double buffer)*76,800(the maximum size of one radio frame block)=691,200 bits.

According to a second alternative embodiment of the present invention, memory 406 is implemented using dual-ported memory. Dual ported memory obviates the need to have a separate physical memory device per radio frame block. Comparing the two example embodiments, a single-ported memory will use less chip area and consume less power, but may need more address decoding logic in read/write unit 402 since the single-ported embodiment cannot be implemented with one device. As will be apparent, various other memory implementations are contemplated within the scope of the principles described herein.

Figure 6:
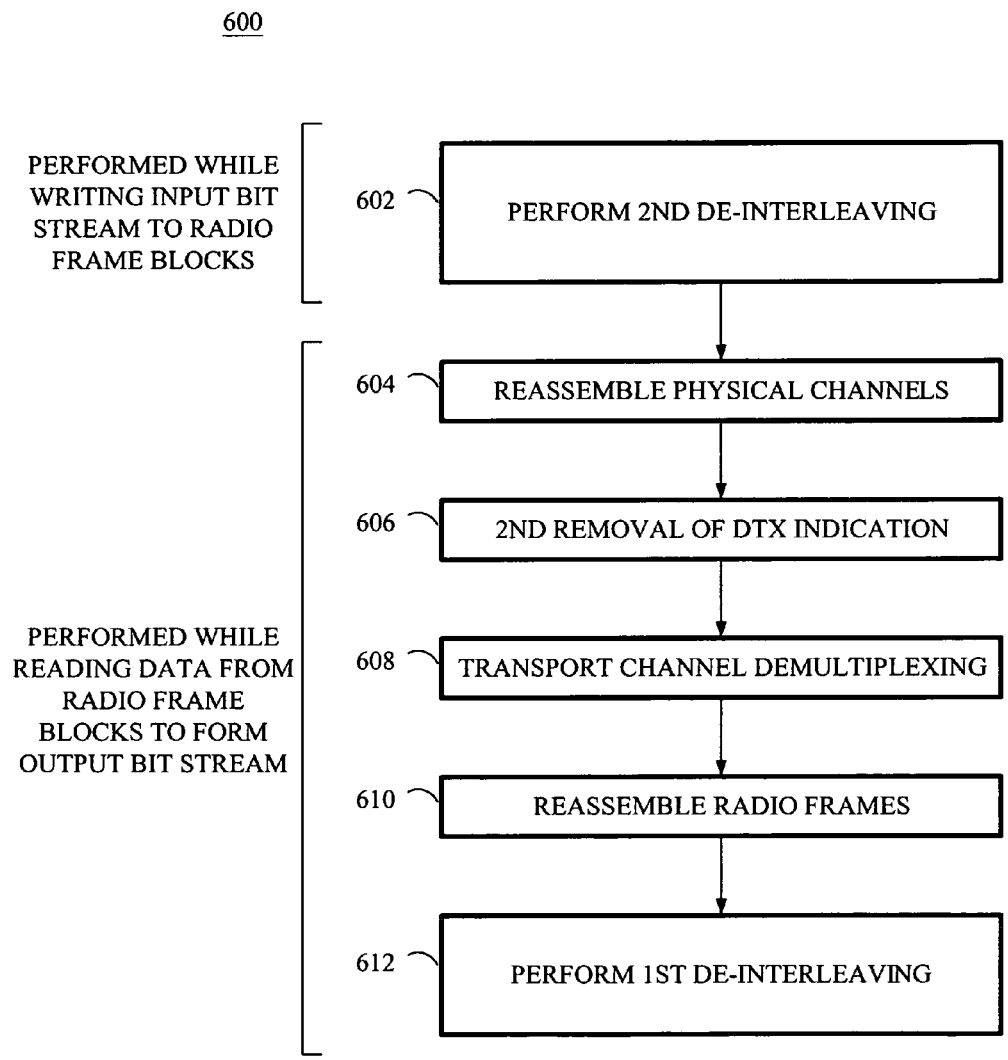
FIG. 6 is a flowchart that describes the operations of a unified de-interleaver according to an example embodiment of the present invention.

FIG. 6 is a flowchart 600 that describes the operations of read/write unit 402 according to an example embodiment of the present invention. In operation 602, the input bit stream is written to memory 406 according to a pattern determined by the second de-interleaving operation. According to the description of the second de-interleaving in the 25.212 specification, data is written into the columns of a matrix, the columns are shuffled, and then the data in read out in rows.

These data manipulations define the second de-interleaving pattern. Radio frame blocks 404 are successively filled as radio frames of data are received, one radio frame of data per radio frame block 404.

Read/write unit 402 generates write addresses so that the input data stream (demodulated physical channel data from demodulator 352) is written to radio frame blocks 404 according to the second de-interleaving pattern. Alternatively, the input data stream is stored in radio frame blocks 404 without de-interleaving, but when the data is read out read/write unit 402 generates read addresses according to the second de-interleaving pattern. The second de-interleaving pattern can therefore be applied as data is written to or read from memory 406. Alternatively still, a portion of the second de-interleaving pattern can be applied as data is written to memory 406, and the remaining portion of the pattern can be applied as data is read from memory 406. Unless otherwise indicated, the following description assumes for illustrative purposes the first example embodiment in which the second de-interleaving is performed as data is written to memory 406.

According to an example embodiment of the present invention, the remaining operations depicted in FIG. 6 are performed as data is read from memory 406 to form an output data stream. As described above with respect to operation 602, read/write unit 402 generates read addresses to effectuate the following operations. In operation 604, the physical channels are reassembled by reading the data from a single radio frame block 404, and concatenating the data from all the physical channel blocks 602 in that radio frame block. Read/write unit 402 therefore generates addresses to read from a current physical channel block, and when the end of the current physical channel block is reached, read/write unit 402 automatically jumps to the next physical channel block and continues reading. In operation 606, the second removal of DTX bits is performed by, for example, dropping bits from the end of the combined radio frame block stream. Read/write unit 402 can be configured to drop bits during a read sequence by merely skipping the bits to be dropped.

In operation 608, transport channel de-multiplexing is performed by taking the first part of the data stream from a radio frame block 404 and processing it as data for the first transport channel, then taking the next part of the data stream and processing it as data for the next transport channel, and so on, until all the data has been distributed amongst transport channels 382. In operation 610, an output bit stream is formed by reassembling the radio frames on each transport channel 382.

According to an example embodiment of the present invention, operations 608 and 610 can be combined into a single process. As described above, data is received for one or more transport channels 382 in a given TTI, where each transport channel has a corresponding TTI. Unified de-interleaver 400 begins processing a transport channel 382 once memory 406 contains all the data received during the transport channel's TTI. It is more efficient to process one transport channel to completion before starting with the next. Read/write unit 402 therefore reads all the data for a given transport channel 382 from each radio frame block 404 until all the data for this transport channel has been read. The next transport channel 382 is then processed by beginning to read at the point where processing of the previous transport channel left of in each radio frame block 404. Read/write unit 402 maintains a "last address read" pointer for each radio frame block 404 to keep track of where processing ends after each transport channel is processed. This combined process effectively performs both radio frame re-assembly and transport channel de-multiplexing.

In operation 612, the first de-interleaving operation is performed as data is read from radio frame blocks 404 according to a pattern described in the 25.212 specification. This operation can also be combined with the processing described in the preceding paragraph by modifying the order in which read/write unit 402 jumps from one radio frame block 404 to the next (while processing one transport channel) to reflect the first de-interleaving pattern.

Utilizing a single memory buffer 406 according to the present invention in combined de-interleaver 400 requires a single read/write unit 402, rather than separate read/write units 362 and 368 for each de-interleaver required by the conventional implementation. As a result, the chip real estate and power usage associated with the extra read/write unit are saved. Furthermore, the conventional implementation requires that each bit be written to and read from second de-interleaver memory 364, and then written to and read from first de-interleaver memory 370. Using combined de-interleaver 400, each bit is written to and read from a single memory buffer 406, which can result in a 50% power savings in memory accesses in the receiver.

Although the present invention has been described with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

For example, the techniques described above may also be applied to uplink receiver 110. As described in the 25.212, the interleaving operations in uplink transmitter 114 and downlink transmitter 112 are very similar. Consequently, the de-interleaving operations in uplink receiver 110 and downlink receiver 116 are similar. Uplink receiver 110 can therefore be modified as described above with respect to downlink receiver 116 to achieve similar improvements.

As a second example, while the above example embodiments provide a savings in memory, other example embodiments can sacrifice memory (i.e., extra radio frame blocks) for available processing latency. For example, going from double buffering (9 radio frame blocks) to triple buffering (10 radio frame blocks) increases memory size by 11%, but doubles the latency time available for the channel decoding operation. Though the throughput requirements for the channel decoder do not change, this additional latency does provide additional flexibility in the design of the channel decoder.

CONCLUSION

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

The previous description of the preferred embodiments is provided to enable any person skilled in the art to make or use the present invention. While the invention has been particularly shown and described with reference to preferred embodiments thereof, it will be understood by those skilled in the art that various changes in form and details may be made therein without departing from the spirit and scope of the invention.

What is claimed is:

1. A system for de-interleaving data in a wireless receiver comprising:
    a memory buffer divided into logical partitions representing radio frame blocks and physical channel blocks, each radio frame block storing a single radio frame of data, each radio frame block being divided into two or more of the physical channel blocks, the single memory buffer comprising a separate single-ported memory device for each radio frame block; and
    unified means, coupled to said memory buffer, for performing a first and second de-interleaving of the data stored in said memory buffer, wherein said unified means includes means for reading and writing the data to the memory buffer in connection with said first and second de-interleaving,
    wherein said unified means applies a first portion of a second de-interleaving pattern as data is written to the memory buffer, and wherein said unified means applies a second portion of said second de-interleaving pattern as data is read from the memory buffer.

2. The system of claim 1, wherein said unified means performs said first de-interleaving as the stored data is read from said memory buffer.

3. The system of claim 1, wherein the data comprises radio frames and said unified means causes said radio frames to be stored in said radio frame blocks.

4. The system of claim 3, wherein the data is transmitted over one or more physical channels, wherein each of said radio frames comprises a physical channel frame associated with each physical channel, each of said radio frame blocks comprises a physical channel block associated with each physical channel, and said unified means causes said physical channel frames to be stored in said physical channel blocks.

5. The system of claim 1, wherein the memory buffer is divided into at least nine logical partitions represents at least nine radio frame blocks.

6. The system according to claim 5, wherein said performing means can de-interleave data from eight radio frames while a ninth radio frame is being received.

7. The system according to claim 1, wherein the physical channel blocks are sized to accommodate a maximum physical channel frame size allowed by the system.

8. The system according to claim 1, wherein the physical channel blocks are each sized to accommodate 19,200 bits per physical channel.

9. The system according to claim 1, wherein the radio frame blocks are sized to handle a maximum frame size allowed by the system.

10. A receiver that receives data via a wireless link, said receiver comprising:
    a decoding/demultiplexing unit comprising:
        a memory buffer to store the data, the memory buffer being divided logically into radio frame blocks and physical channel blocks, each radio frame block storing a single radio frame of data, each radio frame block being divided into two or more of the physical channel blocks, and
        means, coupled to said memory buffer, for performing a first and second de-interleaving of the data, wherein said performing means includes means for reading and writing the data to the memory buffer in connection with said first and second de-interleaving,
    wherein said performing means applies a first portion of a second de-interleaving pattern as the data is written into the memory buffer, wherein performing said means applies a second portion of said second de-interleaving pattern as the data is read from the memory buffer, and
    wherein said memory buffer comprises a dual-ported memory device.

11. A system for de-interleaving data in a wireless receiver comprising:
    a memory buffer divided logically into radio frame blocks and physical channel blocks, each radio frame block storing a single radio frame of data, each radio frame block being divided into two or more of the physical channel blocks; and
    a read/write unit coupled to said memory buffer, wherein said read/write unit is configured to perform a first and second de-interleaving of the data,
    wherein the read/write unit applies a first portion of a second de-interleaving pattern as the data is written to the memory buffer,
    wherein the read/write unit applies a second portion of said second de-interleaving pattern as the data is read from the memory buffer, and
    wherein the memory buffer comprises multiple memory devices in which logical divisions do not correspond to physical divisions between the devices.

12. A method for de-interleaving data in a wireless receiver comprising:
    logically divided a memory buffer into radio frame blocks and physical channel blocks, each radio frame block storing a single radio frame of data, each radio frame block being divided into two or more of the physical channel blocks;
    applying a first portion of a second de-interleaving pattern as the data is written into the memory buffer, the data being written into a rectangular matrix;
    applying a second portion of said second de-interleaving pattern as the data is read from the memory buffer; and
    performing a first de-interleaving on the data.

13. The method of claim 12 further comprising:
    reassembling one or more physical channels from the data stored in said memory buffer;
    performing a second removal of discontinuous transmission indication bits from the data stored in said memory buffer;
    demultiplexing the data stored in said memory buffer into a plurality of transport channels; and
    reassembling transport blocks from the data stored in said memory buffer, wherein the data comprises radio frames.

14. A method comprising:
    demodulating data received via a wireless link;
    storing the demodulated data in a memory buffer, the memory buffer being divided logically into radio frame blocks and physical channel blocks, each radio frame block storing a single radio frame of data, each radio frame block being divided into two or more of the physical channel blocks;
    writing said data to said memory buffer to effectively perform a first portion of a second de-interleaving pattern;
    reading said data from said memory buffer to form an output data stream; and
    decoding said output data stream,
    wherein said reading effectively performs a second portion of a second de-interleaving pattern and a first de-interleaving pattern.

15. The method of claim 14 further comprising:
reassembling one or more physical channels from the data stored in said memory buffer;
performing a second removal of discontinuous transmission indication bits from the data stored in said memory buffer;
demultiplexing the data stored in said memory buffer into a plurality of transport channels; and
reassembling transport blocks from the data stored in said memory buffer, wherein the data comprises radio frames.

16. The system according to claim 14, wherein said reading further effectively performs reassembling physical channels and reassembling radio frames.

17. A system for de-interleaving data received at a wireless receiver comprising:
a demodulator configured to demodulate the data;
a memory buffer, coupled to said demodulator, to store said data, the memory buffer being divided logically into radio frame blocks and physical channel blocks, each radio frame block storing a single radio frame of data, each radio frame block being divided into two or more of the physical channel blocks; and
means, coupled to said memory buffer, for performing a first and second de-interleaving of the data stored in said memory buffer, wherein said performing means includes means for reading and writing the data to the memory buffer in connection with said first and second de-interleaving
wherein said performing means performing a first portion of said second de-interleaving as the data is written into the memory buffer and said performing means performing a second portion of said second de-interleaving and said first de-interleaving as the written data is read from said memory buffer.

18. The system of claim 17, wherein said performing means performs said first de-interleaving as the written data is read from said memory buffer.

* * * * *

UNITED STATES PATENT AND TRADEMARK OFFICE
CERTIFICATE OF CORRECTION

PATENT NO. : 7,385,949 B1  Page 1 of 1
APPLICATION NO. : 09/873316
DATED : June 10, 2008
INVENTOR(S) : Louis J. Botha It is certified that error appears in the above-identified patent and that said Letters Patent is hereby corrected as shown below:

Column 10, line 3 delete "performing said" and insert --said performing--.

Column 12, line 10 delete "means performing" and insert --means performs--.

Column 12, lines 12-13 delete "means performing" and insert --means performs--.

Signed and Sealed this

Sixteenth Day of September, 2008

JON W. DUDAS
*Director of the United States Patent and Trademark Office*